US012704776B2

(12) United States Patent
Sugiyama et al.

(10) Patent No.: US 12,704,776 B2
(45) Date of Patent: Aug. 11, 2026

(54) SUBSTRATE FOR MASK BLANKS AND METHOD FOR MANUFACTURING THE SAME

(71) Applicant: Shin-Etsu Chemical Co., Ltd., Tokyo (JP)

(72) Inventors: Tomoaki Sugiyama, Joetsu (JP); Daijitsu Harada, Joetsu (JP); Harunobu Matsui, Joetsu (JP); Naoki Yarita, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 575 days.

(21) Appl. No.: 18/327,136

(22) Filed: Jun. 1, 2023

(65) Prior Publication Data

US 2023/0418149 A1 Dec. 28, 2023

(30) Foreign Application Priority Data

Jun. 23, 2022 (JP) ................................ 2022-101038

(51) Int. Cl.
*G03F 1/24* (2012.01)
*G03F 1/44* (2012.01)

(52) U.S. Cl.
CPC . *G03F 1/24* (2013.01); *G03F 1/44* (2013.01)

(58) Field of Classification Search
CPC ........................................................ G03F 1/22
USPC ............................................................ 430/5
See application file for complete search history.

(56) References Cited

U.S. PATENT DOCUMENTS

2010/0190414 A1 7/2010 Harada et al.
2011/0287219 A1 11/2011 Matsul et al.
2012/0121857 A1* 5/2012 Koike ...................... C03C 3/06 65/117
2016/0209742 A1 7/2016 Hirabayashi et al.
2017/0010540 A1* 1/2017 Dmitriev ............ G03F 7/70283
2018/0157166 A1 6/2018 Ikebe et al.

FOREIGN PATENT DOCUMENTS

JP 2016-134509 A 7/2016
JP 2017-161807 A 9/2017
JP 2010-194705 A 4/2026
WO WO 2016/098452 A1 4/2026

OTHER PUBLICATIONS

Extended European Search Report for European Application No. 23177151.0, dated Nov. 17, 2023.

* cited by examiner

*Primary Examiner* — Chanceity N Robinson
(74) *Attorney, Agent, or Firm* — Birch, Stewart, Kolasch & Birch, LLP

(57) ABSTRACT

A substrate for mask blanks having first and second main surfaces of 152 mm×152 mm square and a thickness of 6.35 mm, wherein: when a range of 132 mm×132 mm square centered on an intersection of diagonal lines is defined as a calculation region in each of the first and second main surfaces, on a substrate surface of the calculation region of at least one of the first and second main surfaces, flatness of the substrate surface of the calculation region based on a least square plane is 100 nm or less, and a difference (PV) between a highest value and a lowest value of a height of a calculation surface represented by a difference between shapes of the substrate surfaces before and after smoothing processing with a Gaussian filter (10 mm×10 mm) based on the least square plane is 20 nm or less.

10 Claims, No Drawings

SUBSTRATE FOR MASK BLANKS AND METHOD FOR MANUFACTURING THE SAME

CROSS-REFERENCE TO RELATED APPLICATIONS

This non-provisional application claims priority under 35 U.S.C. § 119(a) on Patent Application No. 2022-101038 filed in Japan on Jun. 23, 2022, the entire contents of which are hereby incorporated by reference.

TECHNICAL FIELD

The present invention relates to a substrate for mask blanks used for photolithography and a method for manufacturing the same, and more particularly to a substrate for mask blanks suitable for mask blanks used for manufacturing a transfer mask for photolithography in which extreme ultra violet (EUV) light is used for exposure light and a method for manufacturing the same.

BACKGROUND ART

In recent years, as AI and IoT attract attention, arithmetic processing of enormous data is required, and accordingly, speeding up of arithmetic processing and power saving are required. In order to meet this demand, it is necessary to improve the performance of an IC chip, and in general, miniaturization of electrical wiring is adopted as an effective means. For miniaturization of wirings, an increase in NA, and shorter wavelength of exposure light, and the like are mainly adopted, but in recent years, EUV lithography (EUVL) using extreme ultraviolet (EUV) light is being put to practical use.

In EUVL, an exposure mask is one of important elements, and it is extremely important to improve the flatness of a glass substrate for original plates (mask blanks) of the exposure mask in order to realize accurate exposure. As a normal method for manufacturing a glass substrate, double-sided simultaneous polishing is mainly used, but by only the double-sided simultaneous polishing, flatness that is good enough to be used for EUVL cannot be obtained. In order to realize high flatness, it is necessary to correct flatness according to a surface shape by polishing one surface at a time, and for this, a local processing technique such as local etching or local processing is used. These are methods in which the entire substrate is made flat by removing a relatively convex region.

Even if a highly flat glass substrate can be obtained in this manner, there is a limit to the high planarization technology, and thus this is generally solved by the wavefront correction function of an exposure apparatus. By optically correcting the surface shape of the exposure mask with the wavefront correction function, an optically highly flat exposure mask can be used even in a case where the local processing technique is insufficient.

Regarding the flatness in consideration of the wavefront correction function of the exposure apparatus, for example, WO 2016/098452 (Patent Document 1) discloses, in order to obtain high transfer accuracy when a reflective mask prepared using a substrate obtained by subjecting both front and back main surfaces to conventional double-sided polishing and local processing is chucked to the exposure apparatus and exposure transfer is performed, if the shape of the front main surface of the substrate when being electrostatically chucked is brought close to a shape (virtual surface shape) that can be defined by a Zernike polynomial correctable by the wavefront correction function of the exposure apparatus, even if the substrate has a plate thickness variation that influences a change in the shape of the front main surface, the plate thickness variation can be easily corrected by the wavefront correction function of the exposure apparatus, and a transfer mask having such a substrate can perform exposure transfer of a transfer pattern to an object subjected to transfer with high accuracy.

JP-A 2016-134509 (Patent Document 2) discloses a processing trace derived from a processing pitch generated when a local processing tool is used, and discloses that a processing trace derived from local processing generated on the chamfered surface of a substrate end portion adversely affects flatness measurement, and reduces measurement reproducibility, and the measurement reproducibility of the flatness can be improved by polishing the chamfered surface, and removing the waviness component of the end surface.

CITATION LIST

Patent Document 1: WO 2016/098452
Patent Document 2: JP-A 2016-134509
Patent Document 3: JP-A 2010-194705

SUMMARY OF THE INVENTION

The wavefront correction function corrects the three-dimensional shape of the exposure mask by polynomial approximation, but a relatively gentle surface shape component (long-wavelength component) can be described by a low-order simple polynomial, whereas a high-order complex polynomial is required to describe a steep surface shape component (short-wavelength component). Therefore, it is considered that the effect of correcting the long-wavelength component becomes relatively high, and even if the flatness is the same, a difference occurs in the effect of the wavefront correction function between the substrate mainly including the long-wavelength component and the substrate mainly including the short-wavelength component in the wavefront shape of the surface, and a difference occurs in the optical flatness. With miniaturizing the wiring of the EUVL, an exposure mask having higher flatness is required, and further improvement of the wavefront correction function can be sufficiently expected along with the flow, but the wavefront correction function is considered to make it more difficult in the future to further correct the short-wavelength component. Meanwhile, considering that further improvement of flatness by the processing technique of the glass substrate reaches a plateau, it is important to reduce the short-wavelength component that cannot be corrected by the wavefront correction function.

The method described in WO 2016/098452 (Patent Document 1) includes a step of calculating a synthesis plane of a front main surface and a back main surface at the time of adsorption to an exposure apparatus and a step of predicting a surface shape after optical correction from a shape obtained by fitting the synthesis plane with a Zernike polynomial. However, this method defines flatness in a circular region having a diameter of 104 mm, which is narrower than a region actually used for exposure (132 mm×132 mm square) and insufficient. The wavefront correction function considered here is only a long-wavelength component up to the sixth term of the Zernike polynomial, and does not consider a shorter-wavelength component.

JP-A 2016-134509 (Patent Document 2) discloses a waviness component derived from local processing, but relates to a chamfered surface not used for exposure. JP-A 2016-134509 discloses only waviness in a very small region, and the method described in JP-A 2016-134509 (Patent Document 2) does not consider the waviness component over the entire main surface.

The present invention has been made in view of the above circumstances, and an object of the present invention is to provide a substrate for mask blanks which provides an optically highly flat exposure mask provided by the wavefront correction function of an exposure machine in exposure using an exposure mask, particularly exposure by EUVL, and a method for manufacturing the substrate for mask blanks.

As a result of intensive studies to solve the above problems, the present inventors have found that when a predetermined calculation region is set for a main surface of a substrate for mask blanks, the flatness of the calculation region is 100 nm or less on the main surface of the calculation region, and a difference between a highest value and a lowest value of a height of a calculation surface represented by a difference in shape before and after smoothing processing with a Gaussian filter (10 mm×10 mm) is 20 nm or less, so that it is possible to provide a highly flat exposure mask provided by the wavefront correction function in an exposure apparatus in which a steep surface shape component (short-wavelength component) of the main surface is reduced.

The present inventors have found that such a substrate for mask blanks is manufactured by a method including a local processing step and a finish polishing step subsequent to the local processing step; in the local processing step, the shape of the main surface after the finish polishing step is predicted by applying a change in the shape of the main surface after the finish polishing step grasped in advance with respect to the shape of the main surface before the finish polishing step after the local processing step; whether or not the predicted shape of the main surface is a shape having predetermined flatness is evaluated; and in the finish polishing step, by performing polishing to reduce a short-wavelength component, it is possible to reliably and productively manufacture a substrate for mask blanks that provides a highly flat exposure mask provided by a wavefront correction function in an exposure apparatus, and have completed the present invention.

Therefore, the present invention provides a substrate for mask blanks and a method for manufacturing the substrate for mask blanks to be described later.

1. A substrate for mask blanks having two main surfaces of a first main surface and a second main surface of 152 mm×152 mm square and having a thickness of 6.35 mm, wherein when a range of 132 mm×132 mm square centered on an intersection of diagonal lines is defined as a calculation region in each of the first main surface and the second main surface, on a substrate surface of the calculation region of at least one of the first main surface and the second main surface, flatness of the substrate surface of the calculation region based on a least square plane is 100 nm or less, and a difference (PV) between a highest value and a lowest value of a height of a calculation surface represented by a difference between a shape of the substrate surface before smoothing processing with a Gaussian filter (10 mm×10 mm) and a shape after the smoothing processing based on the least square plane is 20 nm or less.

2. The substrate for mask blanks according to 1, wherein in an optional range of 1 mm×1 mm square in the calculation region of at least one of the first main surface and the second main surface, a difference (LS) between a highest value and a lowest value of a height based on the least square plane is 15 nm or less at any position in the calculation region.

3. The substrate for mask blanks according to 1, wherein when, in at least an optional range of 6 mm×6 mm square set in the calculation region of at least one of the first main surface and the second main surface, (1) measuring a surface shape within a range of 6 mm×6 mm square with precision finer than a pitch of 10 μm to create a height map;

(2) creating an x partial differential map obtained by partially differentiating the height map within the range of 6 mm×6 mm in an x direction;

(3) creating a y partial differential map obtained by partially differentiating the height map within the range of 6 mm×6 mm in a y direction;

(4) creating a total differential map from the x partial differential map and the y partial differential map; and (5) calculating a difference (PVXY) between a highest value and a lowest value of the total differential map, the PVXY is 0.1 nm/μm or less at any position in the calculation region.

4. A method for manufacturing a substrate for mask blanks having two main surfaces of a first main surface and a second main surface of 152 mm×152 mm square and having a thickness of 6.35 mm, the method comprising:

a local processing step for at least one of the first main surface and the second main surface; and a finish polishing step subsequent to the local processing step, wherein the local processing step includes:

(A) a step of grasping a change in a shape of the surface before and after the finish polishing step of the main surface;

(B) locally processing the main surface;

(C) measuring the shape of the main surface after the step (B) as the shape of the surface before the finish polishing step;

(D) a step of predicting the shape of the main surface after the finish polishing step by applying the change in the shape of the surface grasped in the step (A) to the shape of the surface before the finish polishing step obtained in the step (C); and (E) a step of evaluating whether or not the shape of the main surface predicted in step (D) is a shape having predetermined flatness, wherein the finish polishing step includes (F) a polishing step of reducing a short-wavelength component of the main surface.

5. The method according to 4, wherein the polishing for reducing the short-wavelength component of the main surface in the step (F) is polishing using a hard polishing cloth.

6. The method according to 4 or 5, wherein when a range of 132 mm×132 mm square centered on an intersection of diagonal lines of the main surface is defined as a calculation region, on a substrate surface of the calculation region of at least one of the first main surface and the second main surface, the shape having the predetermined flatness in the step (E) is a shape in which flatness based on a least square plane of the substrate surface of the calculation region is 100 nm or less.

7. The method according to 6, wherein when a range of 132 mm×132 mm square centered on an intersection of diagonal lines of the main surface is defined as a calculation region, on the substrate surface of the calculation region of at least one of the first main surface and the second main surface, the shape having the predetermined flatness in the step (E) is a shape in which a difference (PV) between a highest value and a lowest value of a height of a calculation surface represented by a difference between a shape of the substrate surface before smoothing processing with a Gaussian filter (10 mm×10 mm) and a shape after the smoothing processing based on the least square plane is 20 nm or less.

8. The method according to 7, wherein in an optional range of 1 mm×1 mm square in the calculation region of at least one of the first main surface and the second main surface, the shape having the predetermined flatness in the step (E) is a shape in which a difference (LS) between a highest value and a lowest value of a height based on the least square plane is 15 nm or less at any position in the calculation region.

9. The method according to 7, wherein when, in an optional range of at least one 6 mm×6 mm square set in the calculation region of at least one of the first main surface and the second main surface, (1) measuring a surface shape within a range of 6 mm×6 mm square with precision finer than a pitch of 10 μm to create a height map;

(2) creating an x partial differential map obtained by partially differentiating the height map within the range of 6 mm×6 mm in an x direction;

(3) creating a y partial differential map obtained by partially differentiating the height map within the range of 6 mm×6 mm in a y direction;

(4) creating a total differential map from the x partial differential map and the y partial differential map; and (5) calculating a difference (PVXY) between a highest value and a lowest value of the total differential map, the shape having the predetermined flatness in the step (E) is a shape in which the PVXY is 0.1 nm/μm or less at any position in the calculation region.

10. The method according to 4 or 5, wherein in the step (E), when the shape of the main surface predicted in the step (D) is not the shape having the predetermined flatness, the local processing step is performed again.

Advantageous Effects of the Invention

A substrate for mask blanks of the present invention can provide an exposure mask in which a main surface of the substrate has a highly flat shape when an exposure mask is wavefront corrected by an exposure apparatus in exposure using the exposure mask, particularly exposure by EUVL. According to a method for manufacturing a substrate for mask blanks of the present invention, such a substrate for mask blanks can be reliably and productively manufactured.

DETAILED DESCRIPTION OF THE INVENTION

Hereinafter, the present invention is described in detail.

A substrate for mask blanks of the present invention has two main surfaces of a first main surface and a second main surface of 152 mm×152 mm square, and has a thickness of 6.35 mm. The substrate of this size is referred to as a so-called 6025 substrate, and is a substrate having two main surfaces of a first main surface and a second main surface of 6 inches×6 inches square and having a thickness of 0.25 inches.

A material of the substrate for mask blanks of the present invention may be a conventionally used material, and is not particularly limited. However, $TiO_2$-doped quartz glass containing $TiO_2$ at 3 to 10 wt %, which has very high dimensional stability at high temperature, is suitably used because the substrate is exposed to high-energy exposure light for drawing a fine pattern. As the raw material substrate of the substrate for mask blanks, a substrate synthesized, molded, and processed according to a conventional method can be used.

The substrate for mask blanks is required to have high flatness. This is because the higher the flatness, the easier the target exposure is achieved, and it can be said that a substrate having higher flatness is a substrate for mask blanks suitable for drawing a fine pattern. The substrate for mask blanks includes the first main surface on which an exposure pattern (such as a wiring pattern) is formed when used as an exposure mask and the second main surface on which no exposure pattern is formed, and the second main surface is adsorbed to and held by an exposure machine. Among them, a reflective mask is mainly used in the most-advanced applications, and thus the flatness of the first main surface is required at an extremely high level. Therefore, in order to improve the flatness of the first main surface, various studies have been made on flattening by a local processing technique.

Meanwhile, a wavefront correction function is present as a function on an exposure machine side. This is a function of optically correcting the surface shape of a substrate having low flatness. According to this, even the substrate having low flatness can be expected to provide an exposure result similar to that of a substrate having high flatness. However, not all shapes can be corrected by using the wavefront correction function, and in general, a gentle wavefront shape can be corrected, but it is difficult to correct a steep wavefront shape. As described above, even in the substrates for mask blanks having the same flatness, the exposure performance varies depending on the ratio between the local gentle wavefront shape and the steep shape.

When a range of 132 mm×132 mm square centered on an intersection of diagonal lines is defined as a calculation region in each of the first main surface and the second main surface in the substrate for mask blanks of the present invention, the substrate surface in the calculation region of at least one of the first main surface and the second main surface preferably has flatness of 100 nm or less. The calculation region is set such that each of four sides of the main surface of the substrate for mask blanks is parallel to each of four sides of the calculation region.

The measurement of the shape of the main surface of the substrate for mask blanks is not particularly limited, but for example, a laser interferometer can be used. The shape that can be measured by the laser interferometer is raw data of the height map of the main surface of the substrate, and in this case, the reference of the height is a table on which the substrate is placed at the time of measurement. In the present invention, regarding the height map of the main surface of the substrate, the least square plane of the main surface (the least square plane of the surface or the height map) is calculated and corrected to the height map based on the least square plane, whereby the influence of the shape of the table on which the substrate is placed can be removed. The flatness is a difference between a highest value (highest height) and a lowest value (lowest height) in a target surface of a difference between the least square plane of the target surface and the target surface when the difference is calculated based on the least-square plane of the target surface. In the present invention, when the target surface is used as the surface of the calculation region, and the difference between the least square plane of the surface of the calculation region and the surface of the calculation region is calculated based on the least square plane of the surface of the calculation region, a difference between a highest value (highest height) and a lowest value (lowest height) in the surface of the calculation region of the difference is defined as flatness.

The flatness of the calculation region is preferably 100 nm or less, more preferably 80 nm or less, and still more preferably 70 nm or less. When the flatness is 100 nm or less, in the exposure using the exposure mask obtained from the substrate for mask blanks through the mask blanks, the exposure with good transfer accuracy can be realized. Meanwhile, when the flatness is larger than 100 nm, there is a possibility that good exposure may be unrealizable.

By separating a wavelength component that can be corrected by the wavefront correction function of the exposure machine (the influence of the wavefront shape is alleviated by the wavefront correction function) from a wavelength component that is difficult to correct (the influence of the wavefront shape is not substantially alleviated by the wavefront correction function) in the shape of the main surface, it is possible to grasp the shape of the main surface in a state where the exposure mask is corrected by the exposure machine with higher accuracy. Here, the correctable wavelength component is a long-wavelength component corresponding to a relatively gentle wavefront shape, and the wavelength component that is difficult to correct is a short-wavelength component corresponding to a relatively steep wavefront shape.

In the substrate for mask blanks of the present invention, when a range of 132 mm×132 mm square centered on an intersection of diagonal lines is a calculation region in each of the first main surface and the second main surface, and the substrate surface of the calculation region which reflects a difference between a highest value and a lowest value of the height of the short-wavelength component on the substrate surface of the calculation region of at least one of the first main surface and the second main surface is subjected to smoothing processing, a difference (PV) between the highest value and the lowest value of the height of the calculation surface represented by a difference between the shape of the substrate surface before the smoothing processing and the shape after the smoothing processing is preferably 20 nm or less. The reference of the height can be the least square plane of the main surface (that is, the main surface before the smoothing processing) of the calculation region.

This smoothing processing is processing of converting a surface having a wavefront shape into a smoother surface by mathematical processing. In the smoothing processing, a Gaussian filter used in image processing or the like can be used, and specifically, smoothing processing by a Gaussian filter (10 mm×10 mm) is preferable. The Gaussian filter is used for smoothing processing of smoothing the minute region over the entire surface. Specifically, an X-mm Gaussian filter is a filter that calculates a rate based on the following formula using a Gaussian distribution function such that the weight decreases as the distance increases, focusing on the periphery X mm×X mm of a certain measurement point.

$$f(x, y) = 1/(2\pi\sigma^2)\exp(-(x^2+y^2)/(2\sigma^2))$$

By using the Gaussian filter, particularly the Gaussian filter of 10 mm×10 mm, in the surface shape of the exposure mask, the surface after the smoothing processing can be estimated as a surface reflecting the wavelength component (long-wavelength component) correctable by the wavefront correction function of the exposure machine, and this can be used as the height map of the long-wavelength component. Meanwhile, the calculation surface represented by the difference between the shape of the substrate surface before the smoothing processing and the shape after the smoothing processing is a surface reflecting a wavelength component (short-wavelength component) that is difficult to correct by the wavefront correction function of the exposure machine in the surface shape of the exposure mask.

The difference (PV) between the highest value and the lowest value of the height of the calculation surface is preferably 20 nm or less, more preferably 18 nm or less, still more preferably 15 nm or less, and still more preferably 10 nm or less. When the PV is 20 nm or less, in the exposure using the exposure mask obtained from the substrate for mask blanks through the mask blanks, the exposure with good transfer accuracy can be realized. Meanwhile, when the PV is larger than 20 nm, good exposure may be unrealizable.

In the substrate for mask blanks of the present invention, in an optional range of 1 mm×1 mm square in the calculation region of at least one of the first main surface and the second main surface, the difference (LS: local slope) between the highest value and the lowest value of the height is preferably 15 nm or less at any position of the calculation region (if the optional range of 1 mm×1 mm square is set at any position in the calculation region) (the maximum LS is 15 nm or less). The reference of the height can be the least square plane of the main surface (that is, the main surface before the smoothing processing) of the calculation region. The LS is the flatness of the minute region, and indicates the maximum value of the local inclination in the surface shape. The fact that the LS is large means that an extremely short-wavelength component exists. Since the extremely short-wavelength component cannot be corrected by the wavefront correction function, sufficient exposure characteristics may not be obtained when the LS is large. The LS is further preferably 12 nm or less (the maximum LS is 12 nm or less), and more preferably 10 nm or less (the maximum LS is 10 nm or less). When the LS is 15 nm or less, in the exposure using the exposure mask obtained from the substrate for mask blanks through the mask blanks, the exposure with better transfer accuracy can be realized.

In the substrate for mask blanks of the present invention, when the surface shape is measured with accuracy higher than a pitch of 10 μm in at least one optional range of 6 mm×6 mm square set in the calculation region of at least one of the first main surface and the second main surface, a difference (PVXY) between a highest value and a lowest value of a total differential map obtained by totally differentiating the height map of the surface shape in the region is preferably 0.1 nm/μm or less. Specifically, it is preferable that when, in an optional range of at least one 6 mm×6 mm square set in the calculation region of at least one of the first main surface and the second main surface, (1) measuring a surface shape within a range of 6 mm×6 mm square with precision finer than a pitch of 10 μm to create a height map;
(2) creating an x partial differential map obtained by partially differentiating the height map within the range of 6 mm×6 mm in an x direction;
(3) creating a y partial differential map obtained by partially differentiating the height map within the range of 6 mm×6 mm in a y direction;
(4) creating a total differential map from the x partial differential map and the y partial differential map; and
(5) calculating a difference (PVXY) between a highest value and a lowest value of the total differential map, the PVXY is 0.1 nm/μm or less.

The PVXY is an inclination of a minute region on the order of several μm, and indicates intensity of a local inclination in the surface shape. The fact that the PVXY is large means that an extremely short-wavelength component exists. Since the extremely short-wavelength component cannot be corrected by the wavefront correction function, sufficient exposure characteristics may not be obtained when the PVXY is large. Furthermore, the PVXY is more preferably 0.085 nm/μm or less, and more preferably 0.07 nm/μm or less. When the PVXY is 0.1 nm/μm or less, in the exposure using the exposure mask obtained from the substrate for mask blanks through the mask blanks, the exposure with better transfer accuracy can be realized. In the PVXY, a range of 6 mm×6 mm square at the center of the calculation region is preferably within the above range, and more preferably within the above range (the maximum PVXY is within the above range) at any position in the calculation region (even if an optional range of 6 mm×6 mm square is set at any position in the calculation region).

The total differential map can be created, for example, as follows. First, a height map in a range of 6 mm×6 mm in the calculation region is measured with accuracy finer than a pitch of 10 μm. For the measurement, for example, a 3D optical surface profiler (Nexview, manufactured by Zygo Corporation) can be used. Next, a partial differential map in the x direction of the height map in the created range of 6 mm×6 mm is created. When a height of coordinates for which an x partial differential is to be calculated is Z (x, y), a surrounding height is Z1 to Z8, and a distance between adjacent coordinates is P, the partial differential map in the x direction is calculated by the following formula.

$$\partial Z(x, y)/\partial x = (2\times Z5 - 2\times Z4 + Z3 + Z8 - Z1 - Z6)/P$$

When a height of coordinates for which a y partial differential is to be calculated is Z (x, y), a surrounding height is Z1 to Z8, and a distance between adjacent coordinates is P, the Y partial differential map is calculated by the following formula.

$$\partial Z(x, y)/\partial y = (2\times Z7 - 2\times Z2 + Z8 + Z6 - Z3)/P$$

The total differential map can be obtained by the following formula.

$$\partial^2 Z(x, y)/\partial x \partial y = \left((\partial Z(x, y)/\partial x)^2 + (\partial Z(x, y)/\partial y)^2\right)^{0.5}$$

As described above, by measuring the precise surface shape in the minute region in the range of 6 mm×6 mm and further totally differentiating the surface shape, information on a short-wavelength component of a fine pitch of several μm on the surface can be extracted. When a processing trace of local processing is generated, the PVXY is a high value exceeding 0.1 nm/μm, but for example, a short-wavelength component of a pitch of several μm can be attenuated by finish polishing with a hard polishing cloth as described later, and the PVXY can be reduced to 0.1 nm/μm or less.

Next, a method for manufacturing a substrate for mask blanks of the present invention is described.

A method for manufacturing a substrate for mask blanks according to the present invention includes a local processing step for at least one of a first main surface and a second main surface of the substrate for mask blanks, and a finish polishing step subsequent to the local processing step.

In the manufacture of the substrate for mask blanks, before the local processing step, a raw material substrate for the substrate for mask blanks is prepared from a glass ingot. Usually, the raw material substrate for the substrate for mask blanks can be prepared by first cutting the glass ingot into a predetermined shape, subjecting the glass ingot to outer shape processing, and then polishing the main surface and the end surface. The polishing can be performed in several stages such as rough polishing, precision polishing, and ultra-precision polishing. This polishing can be performed using a polishing cloth and a polishing agent. The polishing agent is not particularly limited, but for example, an aqueous dispersion of cerium oxide having an average primary particle size of 10 to 100 nm, or an aqueous dispersion of silica nanoparticles having an average primary particle size of 10 to 100 nm (colloidal silica aqueous dispersion) or the like can be used.

The shape of the surface obtained only by the local processing is not flat, and is usually a shape (in general, a middle convex shape (a shape in which the central portion of the main surface protrudes), or a middle concave shape (a shape in which the central portion of the main surface is recessed), or the like) that cancels the change in the shape of the surface in finish polishing performed after that. Even if the flatness of the shape of the surface obtained only by the local processing is evaluated, the evaluation deviates from the evaluation result of the shape of the main surface of the substrate for mask blanks that is finally obtained. The change in the shape of the main surface occurring in the finish polishing performed under a predetermined polishing condition after the local processing is reproducible, and the change in the shape of the main surface after the finish polishing under a predetermined polishing condition is grasped, and the change is applied to the shape of the main surface after the local processing to predict the shape of the surface after the finish polishing performed under a predetermined polishing condition. Thus, the shape of the surface obtained after the finish polishing can be evaluated at the stage of the local processing before the finish polishing, and the quality of the shape of the main surface obtained by the finish polishing can be evaluated. The local processing step can be repeated until a predetermined shape is obtained.

In the manufacture of the substrate for mask blanks of the present invention, the local processing step preferably includes:

(A) a step of grasping a change in a shape of the surface before and after the finish polishing step of the main surface;

(B) locally processing the main surface;

(C) measuring the shape of the main surface after the step (B) as the shape of thesurface before the finish polishing step;

(D) a step of predicting the shape of the main surface after the finish polishing step by applying the change in the shape of the surface grasped in the step (A) to the shape of the surface before the finish polishing step obtained in the step (C); and (E) a step of evaluating whether or not the shape of the main surface predicted in step (D) is a shape having predetermined flatness.

In the step (A), the change in the shape of the surface before and after the finish polishing step of the main surface (the change in the shape of the surface after the finish polishing step with respect to the surface after the local processing step) is grasped. For example, this change can be grasped from the shape of the main surface obtained by selecting another substrate for mask blanks having the same shape as that of the main surface from the substrate for mask blanks subjected to the local processing and subjecting this another substrate for mask blanks to predetermined finish polishing. In addition, the change in the shape can also be grasped by simulation. In this case, as another substrate for mask blanks, a substrate in which the shape of the main surface is a middle concave shape that is the target shape in the local processing step, and a substrate in which the flatness of the main surface is less than 300 nm is suitable. The step (A) may be performed after the step (B) or after the step (C).

In the step (B), the main surface is locally processed, but in the local processing, a predetermined processing condition in the local processing is set in a manner that the main surface has a predetermined shape in consideration of the shape of the main surface before and after the local processing and the change in the shape of the surface after the finish polishing step. Specifically, for example, when the shape changes to be convex by finish polishing, the main surface preferably has a shape that cancels this change (for example, a low convex shape or a concave shape) in consideration of the change. When the shape changes to be concave by finish polishing, the main surface preferably has a shape that cancels this change (for example, a shallow concave shape or a convex shape) in consideration of the change. The shape of the main surface is appropriately measured as necessary before the local processing, but the measurement is not particularly limited, and for example, a laser interferometer can be used.

In the local processing, the main surface of the substrate for mask blanks is subjected to processing of selectively removing a relatively convex portion. The local processing can be performed by polishing using a polishing cloth and a polishing agent. The polishing agent is not particularly limited, but for example, an aqueous dispersion of cerium oxide having an average primary particle size of 10 to 100 nm, or an aqueous dispersion of silica nanoparticles having an average primary particle size of 10 to 100 nm (colloidal silica aqueous dispersion) or the like can be used. For the local processing, a method such as magneto rheological finishing (MRF) can also be applied.

In the step (C), the shape of the main surface after the step (B), that is, after actual local processing is measured as the shape of the surface before the finish polishing step, but this measurement is not particularly limited, and for example, a laser interferometer can be used.

In the step (D), the change in the shape of the main surface grasped in the step (A) is applied to the shape of the main surface obtained in the step (C) to predict the shape of the main surface after the finish polishing step, and the change in the shape of the main surface grasped in the step (A) is selected according to the shape of the main surface after the local processing obtained in the step (C). Here, for example, when the shape of the main surface after the local processing step are denoted by S1, and the shape change of the main surface when predetermined finish polishing is performed is denoted by ΔS, the following formula is satisfied.

$$S1 + \Delta S = S2$$

Thus, the shape (S2) of the main surface after the finish polishing step can be predicted.

In the step (E), it is evaluated whether or not the shape of the main surface predicted in the step (D) has predetermined flatness. As this evaluation method, a method for measuring the shape of the main surface and evaluating a predetermined value calculated from the measured shape or a predetermined value obtained by mathematically processing the measured shape can be used.

As the shape having flatness in the step (E), for example, when a range of 132 mm×132 mm square centered on an intersection of diagonal lines of the main surface is defined as a calculation region, on a substrate surface of the calculation region of at least one of the first main surface and the second main surface, a shape in which flatness based on a least square plane of the substrate surface of the calculation region is 100 nm or less, preferably 80 nm or less, and more preferably 70 nm or less can be applied.

As the shape having flatness in the step (E), when the range of 132 mm×132 mm square centered on the intersection of the diagonal lines of the main surface is defined as the calculation region, on the substrate surface of the calculation region of at least one of the first main surface and the second main surface, a shape in which a difference between a maximum value and a minimum value of a height of a short-wavelength component, specifically a difference (PV) between a maximum value and a minimum value of a height of the calculation surface represented by a difference between the shape of the substrate surface before smoothing processing and the shape after the smoothing processing when the substrate surface of the calculation region is subjected to smoothing processing is 20 nm or less, preferably 18 nm or less, more preferably 15 nm or less, and still more preferably 10 nm or less can also be applied. The reference of the height can be the least square plane of the main surface (that is, the main surface before the smoothing processing) of the calculation region. The smoothing processing is as described above, and the smoothing processing using the Gaussian filter, particularly, the Gaussian filter (10 mm×10 mm) is preferable.

As the shape having flatness in the step (E), a shape in which the difference (LS) between the highest value and the lowest value of the height based on the least-square plane is 15 nm or less (the maximum LS is 15 nm or less), preferably 12 nm or less (the maximum LS is 12 nm or less), and more preferably 10 nm or less (the maximum LS is 10 nm or less) at any position of the calculation region (even if an optional range of 1 mm×1 mm square may be set at any position in the calculation region) in an optional range of 1 mm×1 mm square in the calculation region of at least one of the first main surface and the second main surface can also be applied. The reference of the height can be the least square plane of the main surface (that is, the main surface before the smoothing processing) of the calculation region.

As the shape having flatness in the step (E), a shape in which, when the surface shape is measured with accuracy higher than a pitch of 10 μm in at least one optional range of 6 mm×6 mm square set in the calculation region of at least one of the first main surface and the second main surface, a difference (PVXY) between a highest value and a lowest value of a total differential map obtained by totally differentiating a height map of the surface shape in the region is 0.1 nm/μm or less, preferably 0.085 nm/μm or less, and more preferably 0.07 nm/μm or less can also be applied. The PVXY can be obtained by (1) to (5) described above. In the PVXY, a range of 6 mm×6 mm square at the center of the calculation region is preferably within the above range, and more preferably within the above range (the maximum PVXY is within the above range) at any position in the calculation region (even if an optional range of 6 mm×6 mm square is set at any position in the calculation region).

In the step (E), when the shape of the main surface predicted in the step (D) is a shape having predetermined flatness, the process can proceed to the finish polishing step. Meanwhile, in the step (E), when the shape of the main surface predicted in the step (D) is not a shape having predetermined flatness, the local processing step, specifically, the local processing step including the steps (A) to (E) can be performed again, and the local processing step, specifically, the local processing step including the steps (A) to (E) can be repeated until the shape of the main surface predicted in the step (D) becomes a shape having predetermined flatness.

A surface defect level obtained only by the local processing may not be sufficient particularly in a substrate for mask blanks for state-of-the-art products, and thus in manufacturing the substrate for mask blanks, a finish polishing step is generally performed following the local processing step. Also in the method for manufacturing a substrate for mask blanks of the present invention, the finish polishing step following the local processing step is performed, and this finish polishing step preferably includes:

(F) a polishing step of reducing a short-wavelength component of the main surface.

In the step (F), the steep surface shape component (short-wavelength component) in the surface shape generated in the local processing step up to the step (E) is reduced (the amplitude of the wavefront is attenuated). In general, in the polishing before the local processing step, a method for simultaneously polishing the entire surface of the substrate is adopted, and the surface shape cannot be finely adjusted. In the local processing step, the surface shape can be finely adjusted over the entire substrate by integrating the processing of minute regions. However, in this step, local processing is continuous, and thus a short-wavelength component derived from a processing pitch may be generated. Therefore, even if the flatness becomes sufficient by the local processing, in many cases, the short-wavelength component increases after the local processing.

The polishing of reducing the short-wavelength component of the step (F) is preferably polishing using a hard polishing cloth. In the case of a soft polishing cloth, the polishing cloth is easily deformed along the fine irregularities of the substrate surface, and the same load is applied to a concave portion and a convex portion, whereby there is no difference in polishing allowance, and as a result, the convex portion remains. Meanwhile, in the case of the hard polishing cloth, it is considered that the polishing cloth is less likely to be deformed along the fine irregularities of the substrate surface, and the load on the convex portion increases, whereby the allowance for the convex portion increases, and as a result, the convex portion decreases. Therefore, the hard polishing cloth is effective for polishing for reducing the short-wavelength component.

As the hard polishing cloth, a hard polishing cloth having a two-layer structure of an NAP layer and a base layer (for example, a suede type hard polishing cloth) is preferably used. The material of the NAP layer is preferably a material containing an ester-based, ether-based, or polycarbonate-based urethane resin. The surface average pore size of the NAP layer is preferably 10 μm or more, preferably 50 μm or less, and more preferably 30 μm or less. The thickness of the NAP layer is preferably 400 μm or more, more preferably 450 μm or more, and still more preferably 500 μm or more, and preferably 650 μm or less. Meanwhile, it is preferable that the base layer is a portion that is not in direct contact with the substrate, and the base layer has high hardness such that a short-wavelength component derived from a surface plate is hardly transferred to a surface to be polished. The material of the base layer is not particularly limited, and examples thereof include PET (polyethylene terephthalate). In the case of the PET base layer, a base layer having a thickness of 0.1 to 0.2 mm is suitably used from the viewpoint of stretchability and heat dissipation. The hardness of the polishing cloth is preferably 40 or more, more preferably 50 or more, and still more preferably 60 or more in Shore A hardness. Note that the polishing cloth can be selected by appropriate conversion into an index of different rubber hardness such as Shore E or Asker C.

The polishing in the step (F) can be performed by entraining a polishing slurry containing colloidal silica containing an average primary particle size of 10 to 100 nm as a principal component (colloidal silica aqueous dispersion) to a polishing cloth. As a polishing method, batch double-sided polishing is common, but single wafer polishing or single-sided polishing may be used. The step (F) can be performed with a polishing pressure of 50 to 200 gf/cm$^2$ (4.9 to 19.6 kPa), but this is appropriately set depending on a polishing method and processing conditions, and is not particularly limited.

The finish polishing step may include (G) a polishing step using a soft polishing cloth after performing polishing using the hard polishing cloth in the step (F).

In the step (F), it is preferable to use the hard polishing cloth for reducing the short-wavelength component of the substrate surface, but in the case of using the hard polishing cloth, it may be difficult to set quality such as defects and surface roughness to a level required for the state-of-the-art products. Therefore, it is preferable to improve the surface quality by performing polishing using the soft polishing cloth as the step (G) as necessary.

In the polishing in the step (G), for example, double-sided simultaneous polishing can be performed using a soft polishing cloth and a polishing slurry composed of fine colloidal silica (colloidal silica aqueous dispersion). For the polishing in the step (G), for example, a soft polishing cloth having Shore A hardness of less than 40 (for example, a suede type soft polishing cloth) and an aqueous dispersion of colloidal silica having an average primary particle size of 10 to 100 nm can be used. Note that the polishing cloth can be selected by appropriate conversion into an index of different rubber hardness such as Shore E or Asker C. The polishing conditions can be appropriately selected according to a conventional method, and are not particularly limited.

The shape of the main surface of the substrate for mask blanks finally obtained after the finish polishing step can also be appropriately measured, and for this measurement, for example, a laser interferometer can be used without particular limitation. Furthermore, from the result, the flatness of the substrate for mask blanks finally obtained after the finish polishing can also be evaluated.

According to the method for manufacturing the substrate for mask blanks of the present invention, the flatness of the exposure mask after wavefront correction using the exposure mask obtained from the substrate for mask blanks through the mask blanks, in other words, the flatness of the exposure mask at the time of exposure using the exposure mask can be predicted with extremely high accuracy at the stage of the substrate for mask blanks. In this case, the shape (S2) of the main surface after the finish polishing step predicted in the step (D) can be the shape of the substrate for mask blanks finally obtained after the finish polishing. Furthermore, according to the method for manufacturing the substrate for mask blanks of the present invention, the substrate for mask blanks having good flatness can be manufactured based on this prediction.

EXAMPLES

Hereinafter, the present invention is specifically described with Examples, but the present invention is not limited to the following Examples.

Examples 1 and 2

Nine glass substrates (sizes of first main surface and second main surface: 152 mm×152 mm square, thickness: 6.35 mm) formed of $SiO_2$ and $TiO_2$ ($TiO_2$ concentration: about 7 wt %) were prepared. The end surface (four surfaces other than the main surface) of the glass substrate was subjected to chamfering and grinding, and further subjected to rough polishing processing and precision polishing with a polishing liquid containing cerium oxide abrasive grains. Thereafter, five glass substrates (substrate 1-1 to substrate 1-5) in Example 1 and four glass substrates (substrate 2-1 to substrate 2-4) in Example 2 were set in a carrier of a double-side polishing apparatus to which a suede type soft polishing cloth was applied, and the first main surface and the second main surface were subjected to ultra-precise polishing using a polishing liquid of colloidal silica abrasive grains. After the ultra-precision polishing, silica nanoparticles were removed by washing with a washing liquid containing KOH, and after drying, the shapes of the first main surface and the second main surface were measured with a surface shape measuring apparatus (UltraFlat, manufactured by Tropel Corporation).

Next, a local processing step was performed. First, processing conditions for local processing were determined based on the shape of the obtained main surface, and the first main surface and the second main surface of the glass substrate were locally processed by a local processing apparatus based on the determined processing conditions (step (B)). As the local processing apparatus, a local processing apparatus described in JP-A 2010-194705 (Patent Document 3) was used. The local processing using this apparatus polishes the entire surface of the substrate while controlling the moving speed of a fine polishing tool, and the target shape can be obtained by slowly moving the polishing tool in a relatively convex portion and rapidly moving the polishing tool in a relatively concave portion. As a processing tool of the local processing apparatus, wool felt buffs were used, and as a polishing slurry, silica nanoparticles (AJ-3540, manufactured by Nissan Chemical Corporation) mixed with a small amount of defoaming agent (Shin-Etsu Silicone KS-537, manufactured by Shin-Etsu Chemical Co., Ltd.) were used. The glass substrate after the local processing was washed with a washing liquid containing KOH to remove silica nanoparticles, and dried, and then the shapes of the first main surface and the second main surface were measured with a surface shape measurement apparatus (UltraFlat, manufactured by Tropel Corporation) (step (C)).

Here, in order to grasp the change in the shape of the main surface after finish polishing with respect to the surface after the local processing, another glass substrate was used to similarly perform the local processing. Furthermore, finish polishing similar to the finish polishing described later was performed (step (A)). Thereafter, the shape of the surface after the finish polishing was predicted by applying the grasped change in the shape of the main surface to the shape of the main surface of the glass substrate after the local processing for the nine glass substrates (substrates 1-1 to 2-4) after the local processing (step (D)). The shape of the surface of the glass substrate after the local processing and the predicted shape of the surface after the finish polishing were evaluated as flatness based on the least square plane of the substrate surface in a calculation region which is a range of 132 mm×132 mm square centered on the intersection of the diagonal lines of the main surface of the glass substrate (step (E)). As a result of predicting the shape of the surface after the finish polishing, in the first local processing step, the predicted flatness of the surface after the finish polishing was more than 100 nm in each case, and thus it was evaluated that the shape did not have predetermined flatness. As the second local processing step, the step (B), the step (C), the step (A), the step (D), and the step (E) were performed again.

The shapes of the first main surface and the second main surface after the finish polishing step predicted in the first local processing step were both convex shapes, and it was preferable that the shape of the main surface after the local processing was a concave shape, and thus in Example 1 (the substrate 1-1 to the substrate 1-5), only the first main surface was locally processed so that the shape of the main surface after the local processing was a concave shape in the step (B) of the second local processing step. Meanwhile, in Example 2 (the substrates 2-1 to 2-4), both the first main surface and the second main surface were locally processed so that both the main surfaces had a concave shape. The predicted shape of the surface of each glass substrate after the finish polishing is shown as flatness in Table 1.

TABLE 1

| | Substrate | Flatness of predicted shape (nm) First main surface | Flatness of predicted shape (nm) Second main surface |
|---|---|---|---|
| Example 1 | 1-1 | 86 | |
| | 1-2 | 59 | |
| | 1-3 | 56 | |
| | 1-4 | 88 | |
| | 1-5 | 55 | |
| Example 2 | 2-1 | 76 | 106 |
| | 2-2 | 110 | 53 |
| | 2-3 | 89 | 62 |
| | 2-4 | 107 | 52 |

As a result, in any of the glass substrates, the flatness of the shape of the main surface after the finish polishing predicted for the surface after the second local processing was 100 nm or less. Therefore, the shape of the main surface was evaluated as a shape having predetermined flatness, and the glass substrate after the second local processing step was subjected to a finish polishing step.

In order to reduce the short-wavelength component of the main surface of the glass substrate, the glass substrate was set in a carrier of a polishing apparatus to which a suede type hard polishing cloth having a two-layer structure in which an NAP layer was formed of an ester-based urethane resin and a base layer was formed of PET was applied, polished using a polishing liquid of colloidal silica, and then washed with a washing liquid containing KOH to remove the colloidal silica. After drying, the shape of the main surface was measured with a surface shape measuring apparatus (UltraFlat, manufactured by Tropel Corporation). The shape of the surface after the finish polishing was evaluated as flatness based on the least square plane of the calculation region of the surface after the finish polishing in the calculation region which is a range of 132 mm×132 mm square centered on the intersection of the diagonal lines of the main surface of the glass substrate.

In Example 1 (substrates 1-1 to 1-5), the difference (PV) between the highest value and the lowest value of the height of the calculation surface represented by a difference between the shape of the substrate surface before the smoothing processing with a Gaussian filter (10 mm×10 mm) in the calculation region of the first main surface and the shape after the smoothing processing as well as the flatness of the first main surface based on the least-square plane of the calculation region of the surface after the finish polishing, and the difference (LS) between the highest value and the lowest value of the height based on the least-square plane of the calculation region of the surface after the finish polishing in an optional range of 1 mm×1 mm square in the calculation region of the first main surface were evaluated to obtain the maximum value of LS. In a range of 6 mm×6 mm square at the center in the calculation region of the first main surface, (1) a surface shape is measured within a range of 6 mm×6 mm square with precision finer than a pitch of 10 μm to create a height map;
(2) an x partial differential map obtained by partially differentiating the height map within the range of 6 mm×6 mm in an x direction is created;
(3) a y partial differential map obtained by partially differentiating the height map within the range of 6 mm×6 mm in a y direction is created;
(4) a total differential map is created from the x partial differential map and the y partial differential map; and
(5) a difference (PVXY) between a highest value and a lowest value of the total differential map is calculated, to evaluate PVXY, thereby obtaining the maximum value of PVXY. A 3D optical surface profiler (Nexview, manufactured by Zygo Corporation) was used to measure the surface shape. The results are shown in Table 2.

TABLE 2

| | Substrate | Flatness (nm) | PV (nm) | LS (nm) | PVXY (nm/μm) |
|---|---|---|---|---|---|
| Example 1 | 1-1 | 78 | 11 | 9 | 0.062 |
| | 1-2 | 63 | 15 | 12 | 0.092 |
| | 1-3 | 72 | 14 | 12 | 0.079 |
| | 1-4 | 98 | 11 | 10 | 0.080 |
| | 1-5 | 96 | 10 | 9 | 0.088 |

In Example 2 (substrates 2-1 to 2-4), the flatness of the first main surface and the second main surface, the PV of the first main surface and the second main surface, and the LS of the first main surface and the second main surface were evaluated, and the maximum value of LS was obtained. The results are shown in Table 3.

TABLE 3

| | | First main surface | | | Second main surface | | |
|---|---|---|---|---|---|---|---|
| | Substrate | Flatness (nm) | PV (nm) | LS (nm) | Flatness (nm) | PV (nm) | LS (nm) |
| Example 2 | 2-1 | 98 | 12 | 10 | 87 | 13 | 10 |
| | 2-2 | 92 | 9 | 9 | 81 | 12 | 10 |
| | 2-3 | 95 | 11 | 10 | 82 | 13 | 11 |
| | 2-4 | 91 | 11 | 11 | 63 | 11 | 10 |

Comparative Example 1

Five glass substrates (sizes of first main surface and second main surface: 152 mm×152 mm square, thickness: 6.35 mm) formed of $SiO_2$ and $TiO_2$ ($TiO_2$ concentration: about 7 wt %) were prepared. Rough polishing processing and precision polishing were performed in the same manner as in Example 1. Thereafter, five glass substrates (substrates C1-1 to C1-5) were subjected to ultra-precision polishing in the same manner as in Example 1. After the ultra-precision polishing, silica nanoparticles were removed by washing with a washing liquid containing KOH, and after drying, the shapes of the first main surface and the second main surface were measured with a surface shape measuring apparatus (UltraFlat, manufactured by Tropel Corporation).

Next, a local processing step was performed in the same manner as in Example 1. As a result of predicting the shape of the surface after finish polishing by performing the step (E), in the first local processing step, the predicted flatness of the surface after finish polishing was more than 100 nm in each case, and thus it was evaluated that the shape did not have predetermined flatness. As the second local processing step, the step (B), the step (C), the step (A), the step (D), and the step (E) were performed again.

The shapes of the first main surface and the second main surface after the finish polishing step predicted in the first local processing step were both convex shapes, and it was preferable that the shape of the main surface after the local processing was a concave shape, and thus only the first main surface was locally processed so that the shape of the main surface after the local processing was a concave shape in the step (B) of the second local processing step. The predicted shape of the surface of each glass substrate after the finish polishing is shown as flatness in Table 4.

TABLE 4

| | Substrate | Flatness of predicted shape (nm) First main surface |
|---|---|---|
| Comparative Example 1 | C1-1 | 55 |
| | C1-2 | 38 |
| | C1-3 | 62 |
| | C1-4 | 59 |
| | C1-5 | 98 |

As a result, in any of the glass substrates, the flatness of the shape of the main surface after the finish polishing predicted for the surface after the second local processing was 100 nm or less. Therefore, the shape of the main surface was evaluated as a shape having predetermined flatness, and the glass substrate after the second local processing step was subjected to a finish polishing step.

The glass substrate was set in a carrier of a polishing apparatus to which a suede type soft polishing cloth was applied, polished using a polishing liquid of colloidal silica, and then washed with a washing liquid containing KOH to remove the colloidal silica. After drying, the flatness, PV, and LS of the first main surface were evaluated in the same manner as in Example 1, and the maximum value of LS was obtained. PVXY of the first main surface was evaluated in the same manner as in Example 1, and the maximum value of PVXY was obtained. The results are shown in Table 5.

TABLE 5

| | Substrate | Flatness (nm) | PV (nm) | LS (nm) | PVXY (nm/μm) |
|---|---|---|---|---|---|
| Comparative Example 1 | C1-1 | 40 | 22 | 15 | 0.171 |
| | C1-2 | 41 | 29 | 18 | 0.196 |
| | C1-3 | 55 | 27 | 11 | 0.182 |
| | C1-4 | 47 | 21 | 13 | 0.133 |
| | C1-5 | 93 | 26 | 21 | 0.142 |

From the above results, it is found that the substrate for mask blanks having flatness after the finish polishing of 100 nm or less and PV of 20 nm or less and the substrate for mask blanks having a maximum value of LS of 15 nm or less and a maximum value of PVXY of 0.1 nm/μm or less can be manufactured by the manufacturing method of the present invention. Such a substrate for mask blanks is a substrate for mask blanks in which a short-wavelength component of a main surface is reduced, and with an exposure mask using such a substrate for mask blanks, high-quality exposure can be realized as a most-advanced exposure mask.

Japanese Patent Application No. 2022-101038 is incorporated herein by reference. Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A substrate for mask blanks having two main surfaces of a first main surface and a second main surface of 152 mm×152 mm square and having a thickness of 6.35 mm, wherein when a range of 132 mm×132 mm square centered on an intersection of diagonal lines is defined as a calculation region in each of the first main surface and the second main surface, on a substrate surface of the calculation region of at least one of the first main surface and the second main surface, flatness of the substrate surface of the calculation region based on a least square plane is 100 nm or less, and a difference (PV) between a highest value and a lowest value of a height of a calculation surface represented by a difference between a shape of the substrate surface before smoothing processing with a 10-mm Gaussian filter (10 mm×10 mm) and a shape after the smoothing processing based on the least square plane is 20 nm or less, wherein when, in at least an optional range of 6 mm×6 mm square set in the calculation region of at least one of the first main surface and the second main surface, (1) measuring a surface shape within a range of 6 mm×6 mm square with precision finer than a pitch of 10 μm to create a height map;

(2) creating an x partial differential map obtained by partially differentiating the height map within the range of 6 mm×6 mm in an x direction;

(3) creating a y partial differential map obtained by partially differentiating the height map within the range of 6 mm×6 mm in a y direction;

(4) creating a total differential map from the x partial differential map and the y partial differential map; and (5) calculating a difference (PVXY) between a highest value and a lowest value of the total differential map, and the PVXY is 0.1 nm/μm or less at any position in the calculation region.

2. The substrate for mask blanks according to claim 1, wherein in an optional range of 1 mm×1 mm square in the calculation region of at least one of the first main surface and the second main surface, a difference (LS) between a highest value and a lowest value of a height based on the least square plane is 15 nm or less at any position in the calculation region.

3. A method for manufacturing a substrate for mask blanks having two main surfaces of a first main surface and a second main surface of 152 mm×152 mm square and having a thickness of 6.35 mm, the method comprising:

a local processing step for at least one of the first main surface and the second main surface; and a finish polishing step subsequent to the local processing step, wherein the local processing step includes:

(A) a step of grasping a change in a shape of the surface before and after the finish polishing step of the main surface;

(B) locally processing the main surface;

(C) measuring the shape of the main surface after the step (B) as the shape of the surface before the finish polishing step;

(D) a step of predicting the shape of the main surface after the finish polishing step by applying the change in the shape of the surface grasped in the step (A) to the shape of the surface before the finish polishing step obtained in the step (C); and (E) a step of evaluating whether or not the shape of the main surface predicted in step (D) is a shape having predetermined flatness, wherein the finish polishing step includes (F) a polishing step of reducing a short-wavelength component of the main surface.

4. The method according to claim 3, wherein the polishing for reducing the short-wavelength component of the main surface in the step (F) is polishing using a hard polishing cloth.

5. The method according to claim 3, wherein when a range of 132 mm×132 mm square centered on an intersection of diagonal lines of the main surface is defined as a calculation region, on a substrate surface of the calculation region of at least one of the first main surface and the second main surface, the shape having the predetermined flatness in the step (E) is a shape in which flatness based on a least square plane of the substrate surface of the calculation region is 100 nm or less.

6. The method according to claim 5, wherein when a range of 132 mm×132 mm square centered on an intersection of diagonal lines of the main surface is defined as a calculation region, on the substrate surface of the calculation region of at least one of the first main surface and the second main surface, the shape having the predetermined flatness in the step (E) is a shape in which a difference (PV) between a highest value and a lowest value of a height of a calculation surface represented by a difference between a shape of the substrate surface before smoothing processing with a Gaussian filter (10 mm×10 mm) and a shape after the smoothing processing based on the least square plane is 20 nm or less.

7. The method according to claim 6, wherein in an optional range of 1 mm×1 mm square in the calculation region of at least one of the first main surface and the second main surface, the shape having the predetermined flatness in the step (E) is a shape in which a difference (LS) between a highest value and a lowest value of a height based on the least square plane is 15 nm or less at any position in the calculation region.

8. The method according to claim 6, wherein when, in an optional range of at least one 6 mm×6 mm square set in the calculation region of at least one of the first main surface and the second main surface, (1) measuring a surface shape within a range of 6 mm×6 mm square with precision finer than a pitch of 10 μm to create a height map;

(2) creating an x partial differential map obtained by partially differentiating the height map within the range of 6 mm×6 mm in an x direction;

(3) creating a y partial differential map obtained by partially differentiating the height map within the range of 6 mm×6 mm in a y direction;

(4) creating a total differential map from the x partial differential map and the y partial differential map; and (5) calculating a difference (PVXY) between a highest value and a lowest value of the total differential map, the shape having the predetermined flatness in the step (E) is a shape in which the PVXY is 0.1 nm/μm or less at any position in the calculation region.

9. The method according to claim 3, wherein in the step (E), when the shape of the main surface predicted in the step (D) is not the shape having the predetermined flatness, the local processing step is performed again.

10. The substrate for mask blanks according to claim 1, wherein the 10-mm Gaussian filter (10 mm×10 mm) is a Gaussian filter that calculates a rate based on the following formula:

$$f(x, y) = 1/(2\pi\sigma^2)\exp(-(x^2 + y^2)/(2\sigma^2)),$$

using a Gaussian distribution function such that the weight decreases as the distance increases, focusing on the periphery 10 mm×10 mm of a certain measurement point.

* * * * *